(12) United States Patent
Moon et al.

(10) Patent No.: US 11,719,530 B2
(45) Date of Patent: Aug. 8, 2023

(54) METHOD AND SYSTEM FOR GENERATING INDEPENDENT COHERENT PHOTONS FREQUENCY-STABILIZED TO TRANSITION OF ATOMS FOR LONG-DISTANCE QUANTUM COMMUNICATION

(71) Applicant: Pusan National University Industry-University Cooperation Foundation, Busan (KR)

(72) Inventors: Han Seb Moon, Busan (KR); Heon Oh Kim, Ulsan (KR); Dan Bi Kim, Busan (KR)

(73) Assignee: PUSAN NATIONAL UNIVERSITY INDUSTRY-UNIVERSITY COOPERATION FOUNDATION, Busan (KR)

( * ) Notice: Subject to any disclaimer, the term of this patent is extended or adjusted under 35 U.S.C. 154(b) by 53 days.

(21) Appl. No.: 17/571,532

(22) Filed: Jan. 10, 2022

(65) Prior Publication Data

US 2022/0260358 A1 Aug. 18, 2022

(30) Foreign Application Priority Data

Feb. 15, 2021 (KR) .......................... 10-2021-0019878

(51) Int. Cl.
*H04B 10/70* (2013.01)
*G01B 9/02001* (2022.01)
(Continued)

(52) U.S. Cl.
CPC ........ *G01B 9/02007* (2013.01); *H01S 5/0687* (2013.01); *H01S 5/4012* (2013.01); *H04B 10/70* (2013.01)

(58) Field of Classification Search
CPC . G01B 9/02007; H01S 5/0687; H01S 5/4012; H01S 3/1305; H01S 3/1307; H01S 5/14; H01S 5/4025; H04B 10/70
See application file for complete search history.

(56) References Cited

U.S. PATENT DOCUMENTS

| | | | |
|---|---|---|---|
| 2004/0264958 A1* | 12/2004 | Zoller | H04B 10/70 398/40 |
| 2017/0244420 A1* | 8/2017 | Nishida | H03L 7/26 |
| 2022/0075237 A1* | 3/2022 | Mittal | G02F 1/3526 |

FOREIGN PATENT DOCUMENTS

| | | |
|---|---|---|
| JP | 6375637 B2 | 8/2018 |
| KR | 10-1697822 B1 | 1/2017 |
| KR | 10-2005267 B1 | 10/2019 |

OTHER PUBLICATIONS

Heonoh Kim et al., "Hong-Ou-Mandel interference of two independent continuous-wave coherent photons," Photonics Research, Aug. 2020, pp. 1491-1495, vol. 8, No. 9, Chinese Laser Press.
(Continued)

*Primary Examiner* — Jonathan M Hansen
(74) *Attorney, Agent, or Firm* — Cantor Colburn LLP

(57) ABSTRACT

A method and a system for generating independent coherent photons frequency-stabilized to transition of atoms for long-distance quantum communication are provided. The method for generating independent coherent photons frequency-stabilized to transition of atoms for long-distance quantum communication according to the present disclosure, includes generating a photon in a quantum state from a first quantum light source including an alkali atom or an ensemble of alkali atoms therein as a medium, further generating a photon in a quantum state from a second quantum light source spatially separated from the first quantum light source, including the same medium as that of the first quantum light source therein, and oscillating a photon pair obtained by coupling
(Continued)

the photons generated by the first and second quantum light sources as a continuous wave coherent photon (CWCP) for quantum communication.

16 Claims, 11 Drawing Sheets

(51) Int. Cl.
    *H01S 5/0687*     (2006.01)
    *H01S 5/40*     (2006.01)

(56) References Cited

OTHER PUBLICATIONS

Z.Y. Ou et al., "Fourth-order interference technique for determining the coherence time of a light beam," J. Opt. Soc. Am. B, Jan. 1989, pp. 100-103, vol. 6, No. 1, Optical Society of America.

Y. Miyamoto et al., "Measurement of ultrafast optical pulses with two-photon interference," Optics Letters, Jun. 1993, pp. 900-902, vol. 18, No. 11, Optical Society of America.

Hoi-Kwong Lo et al., "Measurement-Device—Independent Quantum Key Distribution," Physical Review Letters, Mar. 2012, 5 pages, American Physical Society.

Z. L. Yuan et al., "Interference of Short Optical Pulses from Independent Gain-Switched Laser Diodes for Quantum Secure Communications," Physical Review Applied, 2014, 6 pages, 064006, American Physical Society.

T. Ferreira Da Silva et al., "Proof-of-principle demonstration of measurement-device—independent quantum key distribution using polarization qubits," Physical Review A, 2013, 7 pages, 052303, American Physical Society.

G. C. Amaral et al., "Few-photon heterodyne spectroscopy," Optics Letters, Mar. 2016, pp. 1502-1505, vol. 41, No. 7, Optical Society of America.

Dan-Bi Kim, "Two-photon interference with continuous-wave coherent photons," Feb. 2020, Master's Thesis, Department of physics, The Graduate School, Pusan National University, English abstract.

Henry Semenenko et al., "Interference between independent photonic integrated devices for quantum key distribution," Opt. Lett., 2019, pp. 275-278, vol. 44, No. 2.

Eleftherios Moschandreou et al., "Experimental Study of Hong-Ou-Mandel Interference Using Independent Phase Randomized Weak Coherent States," Journal of Lightwave Technology, 2018, pp. 3752-3759, vol. 36, No. 17.

Y. Ohta et al., "Frequency stabilization of a semiconductor laser using the Rb saturated absorption spectroscopy," Proc. SPIE, Physics and Simulation of Optoelectronic Devices XIV, 2006, 61150P, vol. 6115.

\* cited by examiner

METHOD AND SYSTEM FOR GENERATING INDEPENDENT COHERENT PHOTONS FREQUENCY-STABILIZED TO TRANSITION OF ATOMS FOR LONG-DISTANCE QUANTUM COMMUNICATION

CROSS-REFERENCE TO RELATED APPLICATIONS

This application claims the benefit of Korean Patent Application No. 10-2021-0019878 filed on Feb. 15, 2021, in the Korean Intellectual Property Office, the entire disclosure of which is incorporated herein by reference for all purposes.

BACKGROUND

1. Field of the Invention

One or more example embodiments relate to a continuous wave coherent photon oscillation technology for realizing a quantum interference of two independent coherent photons that are frequency-stabilized to an ultrafine transition of an alkali atom (for example, rubidium) for quantum communication.

2. Description of the Related Art

In order to measure a Hong-Ou-Mandel (HOM) quantum interference phenomenon of photons emitted from independent laser light sources, the photons involved in the interference must be indistinguishable from each other in all possible degrees of freedom such as polarization, frequency, and spatial mode. This means that the two photons contributing to the HOM interference must be in the same condition as if they were generated by a single light source.

The simplest method for verifying the HOM interference phenomenon of independent photons in principle is to split light emitted from one laser into two paths, randomly change a phase of the light traveling in one path, thereby making the phases of the two lights contributing to the interference become uncorrelated with each other. This is because such a method makes a first-order interference pattern due to a constant phase relationship between the two lights do not appear during the measurement time, and all degrees of freedom affecting the HOM interference can be made the same.

In a case where the light sources of two photons contributing to the HOM interference are far away from each other, a coherence time corresponding to a relative time difference range of the two photons arriving at a beam splitter where the HOM interference pattern can be observed is determined by a frequency width of the two light sources. Therefore, it is essential to keep the frequency width of the two light sources or a wavelength bandwidth corresponding thereto almost the same.

In order to measure the HOM interference patterns by using two independent laser light sources, center wavelengths of two wavelength-tunable lasers with very narrow frequency line-widths are matched. In this case, it is necessary to maintain the frequencies of the two lasers stably during the measurement time. Therefore, absolute reliability cannot be secured because the stable maintenance of the frequency is determined by the performance of the laser system.

In order to measure high-definition HOM interference patterns by using independent laser pulses, there is a case in which a filter having a narrow transmission wavelength bandwidth is used. This technology has technical limitations in implementing a narrow transmission wavelength bandwidth.

In order to measure the HOM interference patterns by using two independent laser light sources, a method of constantly maintaining the frequencies of the two separated lasers by using a spectral absorption line of hydrogen cyanide (HCN) gas was used to control the relative frequency change between the two lasers.

Measuring the multi-photon quantum interference phenomenon by using the laser light source having a low intensity of a single photon level is a key technology for realizing quantum information communication.

Among them, measuring the HOM interference by using photons emitted from the lasers that operate independently of each other provides a technology that enables long-distance quantum communication without using a quantum repeater in a photon-based quantum communication technology.

The most representative example is a measurement-device-independent quantum key distribution (MDI-QKD) technology, which is a quantum communication technology that fundamentally blocks an issue of hacking through a single-photon detector.

For the realization of the MDI-QKD technology, it is essential to measure the HOM interference patterns of high clarity by using two independent laser light sources, and the clarity of the interference patterns requires that the frequencies of the two lasers be maintained stably for a long time.

However, there is a technical limit in a method of matching the wavelengths by using a wavelength-tunable laser and maintaining the wavelengths for a long time or a method of using a filter having a narrow wavelength bandwidth.

Therefore, stably maintaining the frequencies of lasers that operate independently of each other for a long time regardless of distance and location is an important core technology that is essential for the practical implementation of a new quantum communication technology such as MDI-QKD.

SUMMARY

An object of example embodiments of the present disclosure is to independently generate a continuous-wave coherent photon (CWCP) stabilized to a transition of an atom (for example, rubidium) through a plurality of spatially separated quantum light sources to utilize the continuous-wave coherent photon (CWCP) for long-distance quantum communication.

An object of example embodiments of the present disclosure is to provide a continuous wave coherent photon (CWCP) that can be utilized for long-distance quantum communication that does not use a quantum repeater by detecting a pair of photons incident through an optical fiber cable of a certain length connected to each of a plurality of quantum light sources to verify whether or not HOM interference measurement is possible (in other words, the visibility of the HOM interference pattern is a certain ratio or more).

An object of example embodiments of the present disclosure is to provide a continuous wave coherent photon (CWCP) that can be utilized for quantum communication through frequency stabilization in various environments by verifying that the visibility of the HOM interference pattern is a certain ratio or more regardless of a separated distance between a plurality of quantum light sources and an optical delay path according to a length of an optical fiber cable connected to the plurality of quantum light sources.

According to an aspect, there is provided a method for generating independent coherent photons frequency-stabilized to transition of atoms for long-distance quantum communication, the method including generating a photon in a quantum state from a first quantum light source including an alkali atom or an ensemble of alkali atoms therein as a medium; further generating a photon in a quantum state from a second quantum light source spatially separated from the first quantum light source, including the same medium as that of the first quantum light source therein, and oscillating a photon pair obtained by coupling the photons generated by the first and second quantum light sources as a continuous wave coherent photon (CWCP) for quantum communication.

According to another aspect, there is provided a system for generating independent coherent photons frequency-stabilized to transition of atoms for long-distance quantum communication, the system including a generating unit configured to generate a photon in a quantum state from a first quantum light source including an alkali atom or an ensemble of alkali atoms therein as a medium, and further generate a photon in a quantum state from a second quantum light source spatially separated from the first quantum light source, including the same medium as that of the first quantum light source therein; and an oscillation unit configured to oscillate a photon pair obtained by coupling the photons generated by the first and second quantum light sources as a continuous wave coherent photon (CWCP) for quantum communication.

Additional aspects of example embodiments will be set forth in part in the description which follows and, in part, will be apparent from the description, or may be learned by practice of the disclosure.

According to example embodiments, the photons in the quantum state emitted from the plurality of quantum light sources that are spatially separated and independently operated are frequency-stabilized to be oscillated, and the pair of the photons incident through the optical fiber cable of a certain length connected to each of the plurality of quantum light sources is detected to verify whether or not the HOM interference measurement is possible. Therefore, it is possible to stably provide the continuous-wave coherent photon (CWCP) which can be utilized for long-distance quantum communication that does not use the quantum repeater.

According to example embodiments, by stabilizing frequencies in the plurality of quantum light sources that operate independently of each other using a fine transition of the atom, it is possible to ensure frequency stability with precision corresponding to the transition of the atom, and reliably provide the stabilized continuous wave coherent photon (CWCP) of the frequency regardless of the separated distance between the plurality of quantum light sources.

BRIEF DESCRIPTION OF THE DRAWINGS

These and/or other aspects, features, and advantages of the invention will become apparent and more readily appreciated from the following description of example embodiments, taken in conjunction with the accompanying drawings of which.

DETAILED DESCRIPTION

Figure 1:
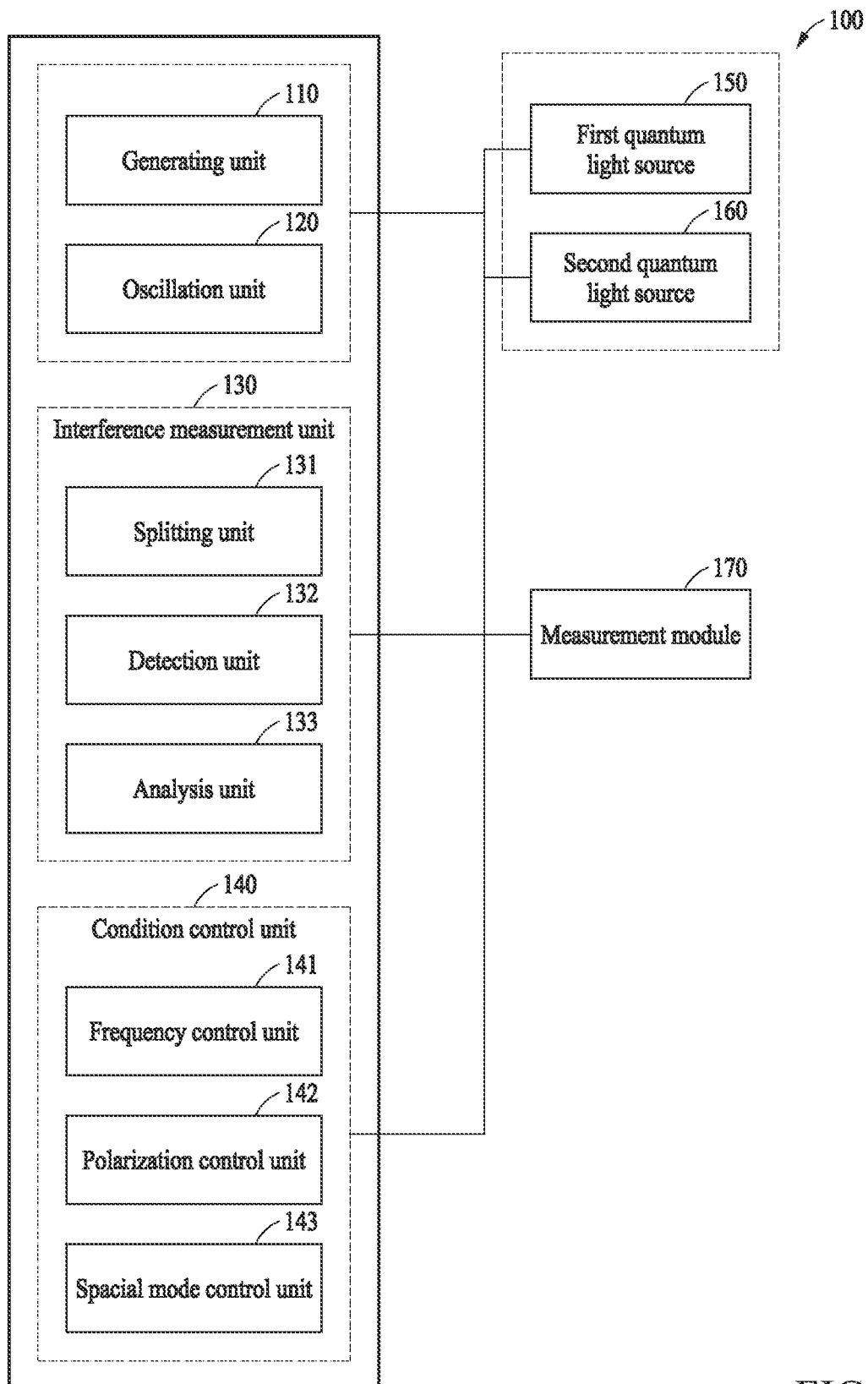
FIG. 1 is a block diagram illustrating a configuration of a system for generating independent coherent photons frequency-stabilized to a transition of atoms for long-distance quantum communication according to an example embodiment.

Hereinafter, example embodiments will be described in detail with reference to the accompanying drawings. However, since various changes may be made to the example embodiments, the scope of the patent application is not limited or limited by these example embodiments. It should be understood that all modifications, equivalents, and substitutes for the example embodiments are included in the scope of the rights.

Terms used in the example embodiments are used for the purpose of description only, and should not be construed as limiting. The singular expression includes the plural expression unless the context clearly dictates otherwise. In the present specification, it should be understood that terms such as "comprise", "include" or "have" are intended to designate that a feature, number, step, operation, component, part, or combination thereof described in the specification exists, and do not preclude in advance a possibility of the existence or addition of one or more other features, numbers, steps, operations, components, parts, or combinations thereof.

Unless defined otherwise, all terms used herein, including technical or scientific terms, have the same meaning as commonly understood by one of ordinary skill in the art to which the example embodiment belongs. Terms such as those defined in a commonly used dictionary should be interpreted as having a meaning consistent with the meaning in the context of the related art, and should not be interpreted in an ideal or excessively formal meaning unless explicitly defined in the present application.

In addition, in the description with reference to the accompanying drawings, the same components are assigned the same reference numerals regardless of the reference numerals, and the overlapping description thereof will be omitted. In the description of the example embodiment, if it is determined that a detailed description of a related known technology may unnecessarily obscure the gist of the example embodiment, the detailed description thereof will be omitted.

FIG. 1 is a block diagram illustrating a configuration of a system for generating independent coherent photons frequency-stabilized to a transition of atoms for long-distance quantum communication according to an example embodiment.

Referring to FIG. 1, a system for generating independent coherent photons frequency-stabilized to a transition of atoms for long-distance quantum communication (hereinafter, 'independent coherent light source generating system') 100 according to an example embodiment may be configured to include a generating unit 110, an oscillation unit 120, a first quantum light source 150, and a second quantum light source 160. According to an example embodiment, the independent coherent light source generating system 100 may be configured by adding a frequency control unit 141, a polarization control unit 142, and a spatial mode control unit 143, respectively. In addition, according to an example embodiment, the independent coherent light source generating system 100 may be configured to include an interference measurement unit 130 and a measurement module 170.

The generating unit 110 generates photons in a quantum state from the first quantum light source 150 including an alkali atom or an ensemble of alkali atoms as a medium therein.

As an example, the first quantum light source 150 is provided with an external-cavity diode laser (ECDL) emitting laser light according to a predetermined resonance frequency, and the generating unit 110 allows the laser light emitted by the external-cavity diode laser (ECDL) to pass through the medium, and splits the laser light that has passed through the medium according to a selected modulation spectroscopy to generate the photons in the quantum state.

Here, the modulation spectroscopy may be selected from at least one of saturated absorption spectroscopy (SAS), polarization spectroscopy (PS), and absorption spectroscopy.

In addition, the generating unit 110 further generates photons in a quantum state from the second quantum light source 160 spatially separated from the first quantum light source 150, including the same medium as that of the first quantum light source therein.

As an example, the generating unit 110 allows the laser light emitted by the external-cavity diode laser (ECDL) provided in the second quantum light source 160 to pass through the medium in the second quantum light source 160, and splits the laser light that has passed through the medium according to a modulation spectroscopy different from that of the first quantum light source 150 to further generate the photons in the quantum state.

As another example, the generating unit 110 may split the laser light by applying the same modulation spectroscopy to the first quantum light source 150 and the second quantum light source 160 to independently generate photons in the quantum state in the first quantum light source 150 and the second quantum light source 160 under the same conditions.

As such, the generating unit 110 may control two or more spatially separated quantum light sources 150 and 160 to operate independently of each other under the same conditions to generate a pair of photons (continuous wave coherent photons (CWCPs)) in the quantum state where the HOM interference measurement for quantum communication can be performed.

On the other hand, in order to generate photons in the quantum state stably for a long time from the spatially separated quantum light sources 150 and 160, it is necessary to stabilize frequencies by matching the frequencies fluctuating as the quantum light sources 150 and 160 operate independently of each other. To this end, the independent coherent light source generating system 100 may be configured to further include a frequency control unit 141.

In each of the first quantum light source 150 and the second quantum light source 160, the frequency control unit 141 feeds back the resonance frequency confirmed from the spectral spectrum obtained by splitting the laser light that has passed through the medium according to a selected modulation spectroscopy, to the external-cavity diode laser (ECDL), and controls a resonance frequency at which the laser light is emitted from the external-cavity diode laser (ECDL) if the fed back resonance frequency is different from a predetermined resonance frequency. In this case, the resonance frequency, which is a reference for frequency control, may be equally determined in the first quantum light source 150 and the second quantum light source 160.

In this case, if the modulation spectroscopies applied to the first quantum light source 150 and the second quantum light source 160 are different from each other, the frequency control unit 141 may stabilize the frequency according to the applied modulation spectroscopy.

Figure 3:
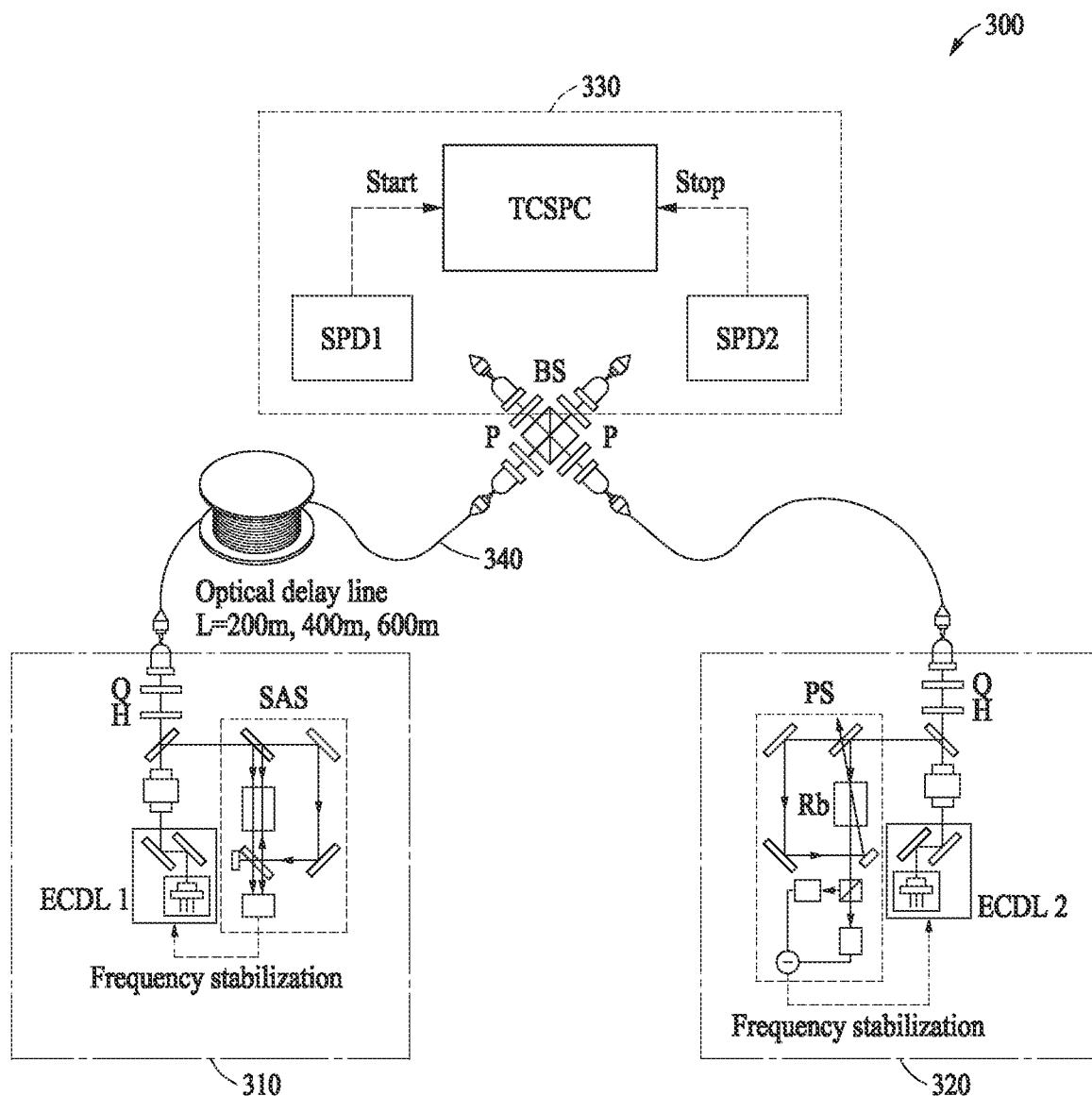
FIG. 3 is a diagram illustrating a system for generating independent coherent photons frequency-stabilized to a transition of atoms for long-distance quantum communication according to an example embodiment.

For example, referring to FIG. 3, in a case where the first quantum light sources 150 and 310 spectrally control the laser light according to saturation absorption spectroscopy (SAS), and the second quantum light sources 160 and 320 spectrally control the laser light according to polarization spectroscopy (PS), the frequency control unit 141 may stabilize the frequency by locking an error-signal obtained by frequency modulation in the first quantum light sources 150 and 310, and may stabilize the frequency individually with high-precision spectra of atoms by using offset locking in the PS in the second quantum light sources 160 and 320.

In this way, the frequency control unit 141 may stabilize the frequency fluctuating in each of the quantum light sources 150 and 160 that are spatially separated and independently operated, so that it is possible to stably generate a pair of photons in the quantum state having a performance usable for quantum communication for a long time regardless of a separated distance between the respective quantum light sources 150 and 160.

The oscillation unit 120 oscillates a photon pair obtained by coupling with photons generated by the first and second quantum light sources 150 and 160 as continuous wave coherent photons (CWCP) for quantum communication.

On the other hand, in order for the photon pair of the photons generated by the first and second quantum light sources 150 and 160 to be utilized for quantum communication, the photon pair must not be distinguished enough to allow measurement of the HOM interference patterns, so that it is necessary to control the polarization state to be the same when the photon pairs are oscillated in the first and second light sources 150 and 160. To this end, the independent coherent light source generating system 100 may be configured to further include the polarization control unit 142.

As an example, the polarization control unit 142 couples the photon pair by performing the polarization control so that the polarization states of photons generated by the first and second quantum light sources 150 and 160 are coherent through a ½λ-phase delay plate (H) and a ¼λ-phase delay plate (Q) which are provided in each of the first and second quantum light sources 150 and 160.

Accordingly, the oscillation unit 120 may oscillate the photon pair of the photons generated by the first and second quantum light sources 150 and 160 as continuous wave coherent photons (CWCP) in a state where polarization states are not distinguished. Therefore, the HOM interference patterns may be effectively measured (observed) by the interference measurement unit 130 to be described later using the independent continuous wave coherent photons (CWCP) from the first and second quantum light sources 150 and 160.

According to an example embodiment, the independent coherent light source generating system 100 may be configured to further include the interference measurement unit 130 and the measurement module 170.

The interference measurement unit 130 serves to perform the HOM interference measurement for the continuous wave coherent photons (CWCP) through the measurement module 170 connected to the first and second quantum light sources 150 and 160 by an optical cable. Here, the interference measurement unit 130 may be configured to include a splitting unit 131, a detection unit 132, and an analysis unit 133. The measurement module 170 may include a beam splitter (BS), a plurality of single-photon detectors (SPD), and a time-correlated single-photon counter (TCSPC).

The splitting unit 131 splits the first photon incident on a beam splitter (BS) through an optical fiber cable connected to the first quantum light source 150 by the beam splitter (BS), and splits the second photon incident on the beam splitter (BS) through an optical fiber cable connected to the second quantum light source 160 by the beam splitter (BS).

For example, in a case where the non-polarization beam splitter (BS) is configured as a 50:50 non-polarization beam splitter, the splitting unit 131 may split the first photon half and half and split the second photon half and half.

The detection unit 132 detects a single photon, which is generated by superimposing the split photon split from the first photon and the split photon split from the second photon into one, by using each of a plurality of single-photon detectors (SPD).

For example, in a case where the plurality of single-photon detectors (SPD) include a single-photon detector SPD1 and a single-photon detector SPD2, the detection unit 132 may detect the first single photon which is generated by superimposing the split photon split from the first photon and the split photon split from the second photon into one, and detect the second single photon which is generated by superimposing another split photon split from the first photon and another split photon split from the second photon into one. Accordingly, both the single-photon detector SPD1 and the single-photon detector SPD2 may check the first photon and the second photon half and half.

The analysis unit 133 analyzes a signal output from each of the plurality of single-photon detectors (SPD) according to the detection through a time-correlated single-photon counter (TCSPC), thereby performing the HOM interference measurement on the continuous-wave coherent photon (CWCP).

As an example, the analysis unit 133 may alternately analyze the signal output from any one of the plurality of single-photon detectors (SPD) through the time-correlated single-photon counter (TCSPC) in a predetermined time unit to perform the HOM interference measurement by using single photons correlated with time.

Figure 6:
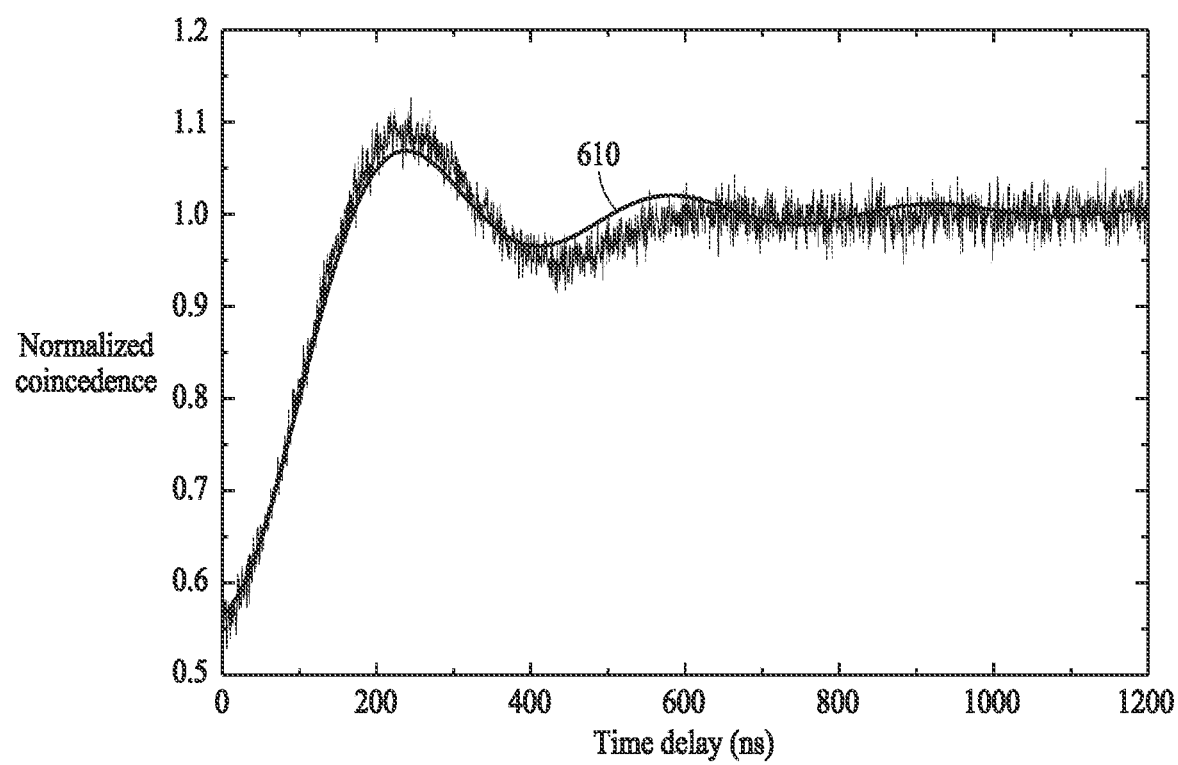
FIG. 6 is a diagram illustrating an example of HOM interference patterns of two independent continuous wave coherent photons (CWCPs) in the system for generating independent coherent photons frequency-stabilized to a transition of atoms for long-distance quantum communication according to an example embodiment.

For example, referring to FIG. 3, the analysis unit 133 analyzes the signal output from the single-photon detectors SPD1 for a predetermined time through the time-correlated single-photon counter (TCSPC) to count the first single photon detected by the single-photon detectors SPD1, analyzes the signal output from the single-photon detectors SPD2 after a certain period of time to count the second single photon detected by the single-photon detectors SPD2, and measures the HOM interference patterns using them, thereby capable of visualizing the measured HOM interference patterns as illustrated in FIG. 6.

Here, if the visibility of the HOM interference pattern is a certain ratio or more, the analysis unit 133 uses the continuous wave coherent photons (CWCP) generated by the first quantum light source 310 and the second quantum light source 320 to determine that it is possible to measure the HOM interference, thereby verifying that the continuous wave coherent photons (CWCPs) have performance capable of being utilized for quantum communication.

According to an example embodiment, the interference measurement unit 130 increases and adjusts a length of the optical fiber cable by n times (where n is a natural number equal to or greater than 2), and then uses the signal output from each SPD to determine whether or not the HOM interference measurement for the continuous-wave coherent photon (CWCP) is possible. In a case where the HOM interference measurement is possible, a result value for implementable long-distance quantum communication corresponding to the length of the optical fiber cable may be output.

For example, as illustrated in FIGS. 8A through 8D to be described later, referring to the results of measuring the HOM interference patterns for two independent continuous-wave coherent photons (CWCP) by setting the length of the optical fiber cable to 0 m, 200 m, 400 m, and 600 m, respectively, it can be seen that the input time delay of the BS due to the difference in optical path length is much longer than the coherence length of the individual continuous-wave coherent photon (CWCP), but the HOM interference is still present and there is no change in visibility.

In other words, if the time-resolved measurement technology is applied to the continuous-wave coherent photons (CWCPs) from two independent quantum light sources 150 and 160 proposed in the present disclosure, the measurement of the HOM interference patterns is possible regardless of the optical path length difference from each of the quantum light sources 150 and 160 to the BS, that is, regardless of the length of the optical fiber cable. Therefore, the continuous-wave coherent photons (CWCPs) generated by independent quantum light sources 150 and 160 may be fully utilized for long-distance quantum communication that does not use the quantum repeater.

On the other hand, in order for the photon pair of photons generated by the first and second quantum light sources 150 and 160 to be utilized for quantum communication, the spatial mode characteristics also need to be indistinguishable enough to allow the measurement of the HOM interference patterns in addition to the above-described frequency and polarization state. To this end, according to an example embodiment, the independent coherent light source generating system 100 further includes a spatial mode control unit 143 that controls the spatial modes of the first quantum light source 150 and the second quantum light source 160 to be the same.

The spatial mode control unit 143 implements the same type and length of the optical fiber cables connected to the first quantum light source 150 and the optical fiber cable connected to the second quantum light source 160, so as to control the spatial mode that is one of factors affecting the quantum interference measurement to be the same in the first and second quantum light sources 150 and 160.

For example, referring to FIG. 3, the spatial mode control unit 143 may implement the cable 340, as an optical fiber cable, which is used when a pair of the photons generated by the independently operating first quantum light sources 150 and 310, and the second quantum light sources 160 and 320 are oscillated, and may make the spatial modes in the first quantum light source 310 and the second quantum light source 320 set under the same conditions. Accordingly, it is possible to make the interference measurement under the same conditions.

The frequency control unit 141, the polarization control unit 142, and the spatial mode control unit 143, which are described above, perform the role of the condition control unit 140 for controlling to make the HOM interference measurement under the same conditions in the first and second quantum light sources 150 and 160 which are spatially separated and independently operated.

Figure 2:
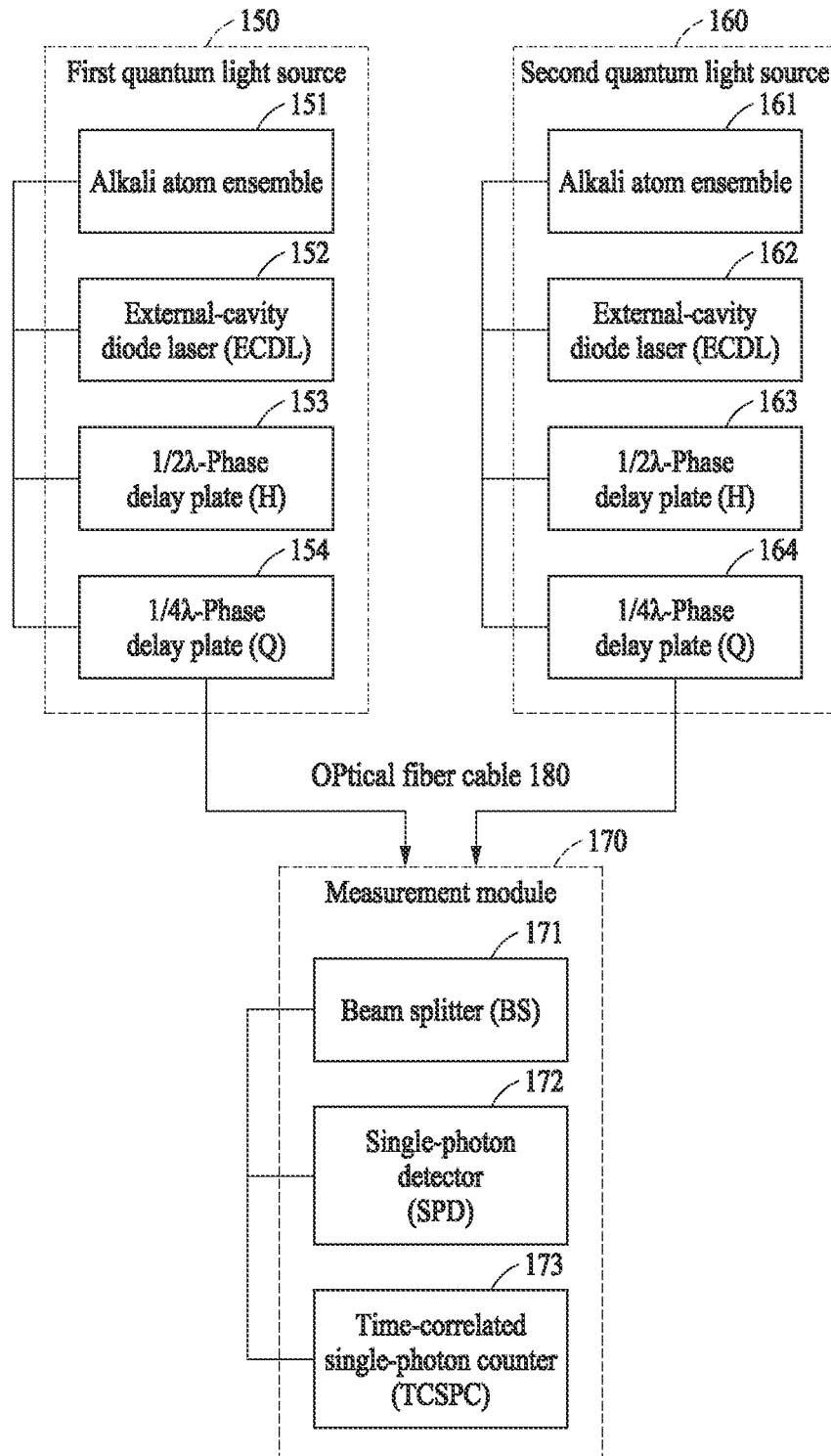
FIG. 2 is a block diagram illustrating a detailed configuration of a first quantum light source, a second quantum light source, and a measurement module in the system for generating independent coherent photons frequency-stabilized to a transition of atoms for long-distance quantum communication according to an example embodiment.

FIG. 2 is a block diagram illustrating a detailed configuration of the first quantum light source, the second quantum light source, and the measurement module in the system for generating independent coherent photons frequency-stabilized to a transition of atoms for long-distance quantum communication according to an example embodiment.

Referring to FIG. 2, the first quantum light source 150 and the second quantum light source 160 are a plurality of spatially separated light sources which independently generate photons in a quantum state according to a selected modulation spectroscopy in which the same alkali atom (for example, 'rubidium') is used as a medium.

The first quantum light source 150 and the second quantum light source 160 may have the same configuration except that the second quantum light source 160 is spatially separated from the first quantum light source 150.

The first quantum light source 150 may be configured to include an alkali atom (for example, 'rubidium') or an alkali atom ensemble 151 used as a medium, an external-cavity diode laser (ECDL) 152, a ½λ-phase delay plate (H) 153, and a ¼λ-phase delay plate (Q) 154.

The second quantum light source 160 may be configured to include an alkali atom or an alkali atom ensemble 161 used as a medium, an external-cavity diode laser (ECDL) 162, a ½λ-phase delay plate (H) 163, and a ¼λ-phase delay plate (Q) 164.

The measurement module 170 is connected to the first and second quantum light sources 150 and 160 via optical cables 180, and is used to measure the HOM interference measurement using the pair of the photons generated by the first and second quantum light sources 150 and 160.

As an example, the measurement module 170 may be configured to include a beam splitter (BS) 171, a single-photon detector (SPD) 172, and a time-correlated single-photon counter (TCSPC) 173.

The beam splitter (BS) 171 receives the first photon incident from the first quantum light source 150 and the second photon incident from the second quantum light source 160, and splits the received first and second photons, and superimposes the split photons to generate a new single photon.

For example, in a case of being implemented as a 50:50 non-polarization beam splitter, the beam splitter (BS) 171 splits the received first and second photons half and half, superimposes a half photon split from the first photon and a half photon split from the second photon to generate the first single photon, and superimposes another half photon split from the first photon and another half photon split from the second photon to generate the second single photon.

The single-photon detector (SPD) 172 outputs a signal detected by the single photon generated by the beam splitter (BS) 171.

As an example, in a case where the single-photon detector (SPD) 172 is implemented as two single-photon detectors SPD1 and SPD2, the single-photon detector SPD1 may output a signal detecting the first single photon, and output a signal detecting the second single photon.

Since the first single photon and the second single photon contain half and half of the first photon and the second photon generated by the first and second quantum light sources 150 and 160, the first photon and the second photon can be checked half and half by detecting the first single photon and the second single photon generated by the BS 171, by the single-photon detector SPD1 and the single-photon detector SPD2, respectively.

The time-correlated single-photon counter (TCSPC) 173 measures the HOM interference pattern by analyzing the signal detected by the single photon output from the single-photon detector (SPD) 172.

As an example, the time-correlated single-photon counter (TCSPC) 173 may stop the signal output from the single-photon detector SPD2 while analyzing the signal output from the single-photon detector SPD1 and counting the first single photon.

In addition, the time-correlated single-photon counter (TCSPC) 173 may stop the signal output from the single-photon detector SPD1 while analyzing the signal output from the single-photon detector SPD2 and counting the second single photon.

In other words, the time-correlated single-photon counter (TCSPC) 173 may alternately analyze the signals output from the single-photon detector SPD1 and the single-photon detector SPD2 with a time difference to perform the HOM interference measurement using the single photons having a correlation with time.

As described above, the time-correlated single-photon counter (TCSPC) 173 applies the time-resolved measurement technology to continuous wave coherent photons (CWCPs) from two independent quantum light sources 150 and 160 to measure the HOM interference pattern. Therefore, it is possible to measure the HOM interference pattern having visibility of a certain ratio or more regardless of a difference in the length of the optical path from each of the quantum light sources 150 and 160 to the beam splitter (BS), that is, regardless of the length of the optical fiber cable.

Therefore, the time-correlated single-photon counter (TCSPC) 173 may verify the continuous wave coherent photons (CWCP) generated from the mutually independent quantum light sources 150 and 160 as having a performance capable of being sufficiently utilized for long-distance quantum communication that does not use a quantum repeater.

As described above, according to the present disclosure, the photons in the quantum state emitted from the plurality of quantum light sources that are spatially separated and independently operated are frequency-stabilized to be oscillated, and the pair of the photons incident through the optical fiber cable of a certain length connected to each of the plurality of quantum light sources is detected to verify whether or not the HOM interference measurement is possible. Therefore, it is possible to stably provide the continuous-wave coherent photon (CWCP) which can be utilized for long-distance quantum communication that does not use the quantum repeater.

According to the present disclosure, by stabilizing frequencies in the plurality of quantum light sources that operate independently of each other using a fine transition of the atom, it is possible to ensure frequency stability with precision corresponding to the transition of the atom, and reliably provide the stabilized continuous wave coherent photon (CWCP) of the frequency regardless of the separated distance between the plurality of quantum light sources.

FIG. 3 is a diagram illustrating a system for generating independent coherent photons frequency-stabilized to a transition of atoms for long-distance quantum communication according to an example embodiment.

Referring to FIG. 3, a system for generating independent coherent photons frequency-stabilized to a transition of atoms for long-distance quantum communication (hereinafter, 'independent coherent light source generating system') 300 of the present disclosure may be configured to include the first quantum light source 310, the second quantum light source 320, a measurement module 330, and an optical fiber cable 340.

The first quantum light source 310 and the second quantum light source 320 are spatially separated and independently operated.

The first quantum light source 310 and the second quantum light source 320 may use an alkali atom (for example, rubidium (Rb)) or an alkali atom ensemble as a medium, allow the laser light emitted according to the resonance frequency determined by two external-cavity diode lasers ECDL1 and ECDL2 to pass through the medium, and split the laser light that has passed through the medium according to the selected modulation spectroscopy to generate each photon in the quantum state.

As an example, as illustrated in FIG. 3, the first quantum light source 310 may split the laser light according to the saturation absorption spectroscopy (SAS), and the second quantum light source 320 separated from the first quantum light source 310 by a predetermined distance may split the laser light according to the polarization spectroscopy (PS), so that photon generation is independently performed in the first quantum light source 310 and the second quantum light source 320 according to different modulation spectroscopies.

Meanwhile, according to an example embodiment, the first quantum light source 310 and the second quantum light source 320 may generate photons according to the same modulation spectroscopy, and a separation distance between the first quantum light source 310 and the second quantum light source 320 is not particularly limited.

In the present specification, when the first quantum light source 310 and the second quantum light source 320 are spatially separated and independently operated, it may mean that the first quantum light source 310 and the second quantum light source 320 independently perform the frequency stabilization in different ways in a case where the photons are generated according to different modulation spectroscopies in the first quantum light source 310 and the second quantum light source 320, in addition to meaning that the photon generation is independently performed.

On the other hand, in order to be able to measure the HOM interference patterns by using two continuous wave coherent photons (CWCPs) through the spatially separated first and second quantum light sources 310 and 320, the first quantum light source 310 and the second quantum light source 320 need to be controlled so that the frequency (spectrum), spatial mode, and polarization state are the same.

First, the independent coherent light source generating system 300 implements the cable 340, as the optical fiber cable, which is used when the photons are incident from the first quantum light source 310 and the second quantum light source 320. The spatial modes in the first quantum light source 310 and the second quantum light source 320 may be set to the same condition.

In addition, the independent coherent light source generating system 300 may control the polarization through the ½λ-phase delay plate (H) and the ¼λ-phase delay plate (Q) when oscillating the photon pair generated by the first quantum light source 310 and the second quantum light source 320, so that the polarization states in the first quantum light source 310 and the second quantum light source 320 are set to the same condition.

In addition, the independent coherent light source generating system 300 may control the frequency according to the modulation spectroscopy used by the first quantum light source 310 and the second quantum light source 320, so that the frequencies (spectra) in the first quantum light source 310 and the second quantum light source 320 are set to the same condition.

For example, as illustrated in FIG. 3, in a case where the first quantum light source 310 spectrally controls the laser light according to the saturation absorption spectroscopy (SAS) and the second quantum light source 320 spectrally controls the laser light according to the polarization spectroscopy (PS), the first quantum light source 310 may stabilize the frequency through error-signal locking obtained by the frequency modulation, but the second quantum light source 320 may individually stabilize the frequency with a high-precision spectrum of atoms by using offset locking light according to the polarization spectroscopy (PS).

Accordingly, in a state where the frequency (spectrum), the spatial mode, and the polarization state in the first quantum light source 310 and the second quantum light source 320 are the same, the measurement of the HOM interference patterns may be performed by using the pair of photons oscillated from the first quantum light source 310 and the second quantum light source 320.

The measurement module 330 measures the HOM interference patterns by using the pair of photons incident through the optical fiber cable 340 from the first quantum light source 310 and the second quantum light source 320, which are spatially separated and independently operated, that is, two continuous wave coherent photons (CWCPs), and verifies the performance of the two continuous wave coherent photons (CWCPs) according to the visibility of the measured HOM interference patterns.

As illustrated in FIG. 3, the measurement module 330 may be configured to include a polarization plate (P), a non-polarization beam splitter (BS), a plurality of single-photon detectors SPD1 and SPD2, and a time-correlated single-photon counter (TCSPC).

The polarization plate (P) receives the first photon incident from the first quantum light source 310 and the second photon incident from the second quantum light source 320 through the optical fiber cable 340 of a predetermined length.

The non-polarization beam splitter (BS) respectively splits the received first and second photons, and superimposes the split photons to generate a new single photon. The single-photon detectors SPD1 and SPD2 respectively output the signals detecting the single photons.

For example, in a case of being implemented as a 50:50 non-polarization beam splitter, the non-polarization beam splitter (BS) may split the received first and second photons half and half, and superimpose the half split photon split from the first photon and the half split photon split from the second photon to generate a new single photon. Therefore the single-photon detector SPD1 and the single-photon detector SPD2 may check the first photon and the second photon half and half.

The time-correlated single-photon counter (TCSPC) alternately analyzes the signals output from the single-photon detector SPD1 and the single-photon detector SPD2, and performs the HOM interference measurement using single photon correlated with time.

As illustrated in FIG. 3, the time-correlated single-photon counter (TCSPC) may analyze the signal output from the single-photon detector SPD1 for a certain time, count the single photons detected by the single-photon detector SPD1, analyze the signal output from the single-photon detector SPD2 after a certain time has elapsed, count the single photons detected by the single-photon detector SPD2, and measure the HOM interference patterns, so that as illustrated in FIG. 6, the HOM interference patterns can be visualized.

Here, if the visibility of the measured HOM interference pattern is a certain ratio or more, the measurement module 330 may verify the continuous wave coherent photons (CWCPs) generated by the first quantum light source 310 and the second quantum light source 320 as having a performance capable of being utilized for long-distance quantum communication that does not use the quantum repeater.

Figure 4A:
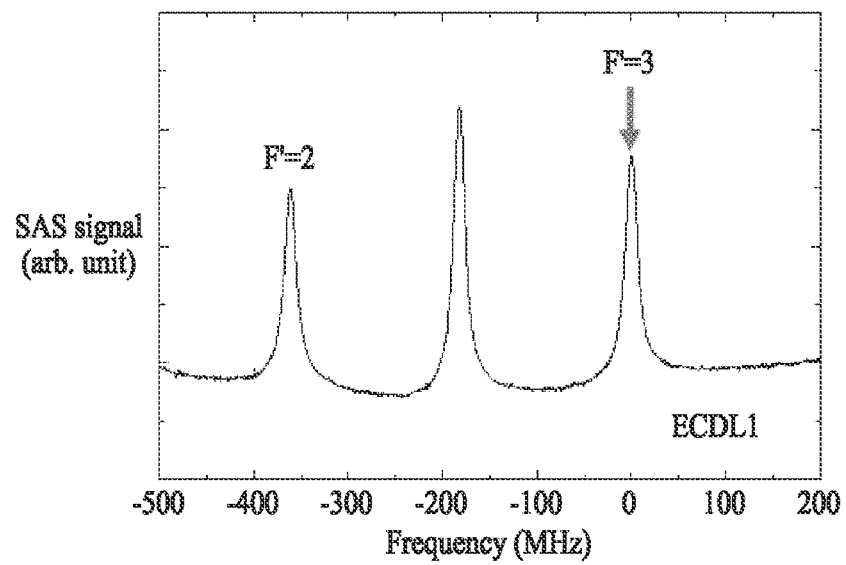
FIGS. 4A and 4B are diagrams illustrating spectral spectra obtained by different modulation spectroscopies in the first and second quantum light sources in the system for generating independent coherent photons frequency-stabilized to a transition of atoms for long-distance quantum communication according to an example embodiment.
Figure 4B:
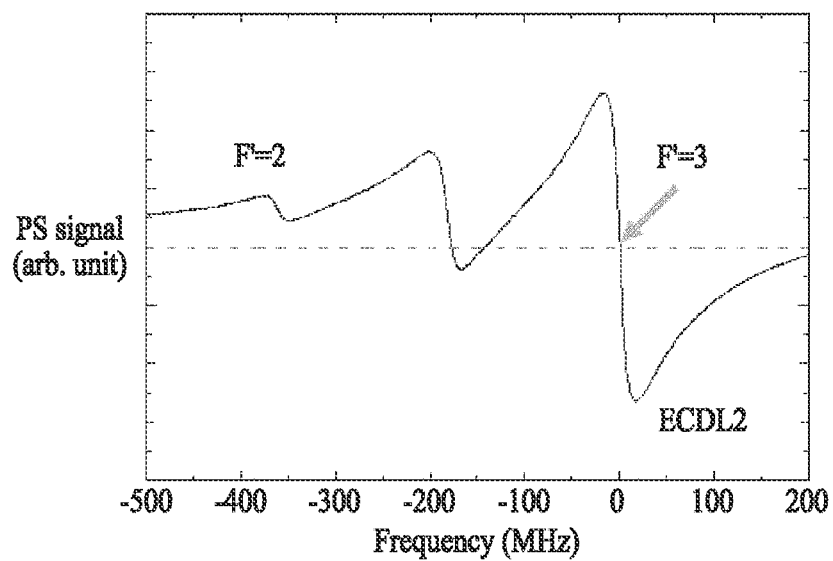

FIGS. 4A and 4B are diagrams illustrating spectral spectra obtained by different modulation spectroscopies in the first and second quantum light sources in the system for generating independent coherent photons frequency-stabilized to a transition of atoms for long-distance quantum communication according to an example embodiment.

FIG. 4A illustrates an example of frequency stabilization in the SAS spectrum obtained by split-controlling the laser light according to the saturation absorption spectroscopy (SAS) in ECDL1 of the first quantum light source 310 of FIG. 3.

FIG. 4B illustrates an example of frequency stabilization in the PS spectrum obtained by split-controlling the laser light according to the polarization spectroscopy (PS) in ECDL2 of the second quantum light source 320 of FIG. 3.

FIGS. 4A and 4B illustrate that the frequency is stabilized at 384,228,115 MHz (indicated by an arrow), which is an optical frequency due to transition of $5S_{1/2}(F=3)-5P_{1/2}$ (F'=2, 3).

In the present disclosure, CWCP light sources (first and second quantum light sources) that are two independent ECDLs have the advantage of photons having the same frequency generation and high frequency stability through frequency stabilization using ultra-fine atomic transitions.

The two CWCPs pass through two single-mode fibers to match the spatial mode, and then enter the 50:50 non-polarization beam splitter (BS). The polarization of the two incident photons is controlled by the ½λ-phase delay plate (half-wave plate) (H) and the ¼λ-phase delay plate (quarter-wave plate) (Q) located at the entrance to the single-mode fiber. After passing through the beam splitter (BS), the two superimposed photons are detected through the single-photon detector (SPD) connected to the two single-mode optical fibers.

The output signals of the two SPDs arrive at the time-correlated single-photon counter (TCSPC), and the HOM interference measurement of the two independent CWCPs is performed by time-resolved measurement.

In order to effectively observe the HOM interference patterns of the two independent CWCPs, the photons generated by the two independent lasers have to be indistinguishable. These two indistinguishable CWCPs must have the same spectra, spatial mode, and polarization state at both input ports of the beam splitter (BS). In particular, it is important to stably and accurately control the spectrum characteristics of the two CWCPs by applying the high-resolution frequency stabilization technology.

Therefore, in the present disclosure, the mutual spectrum between the two coherent light sources is measured by using a beat signal between the two ECDLs, and when the two ECDLs operate in the free-running mode, the width of the beat spectrum is measured at ~1 MHz, which corresponds to a spectrum width of a narrow coherent light source.

Figure 5A:
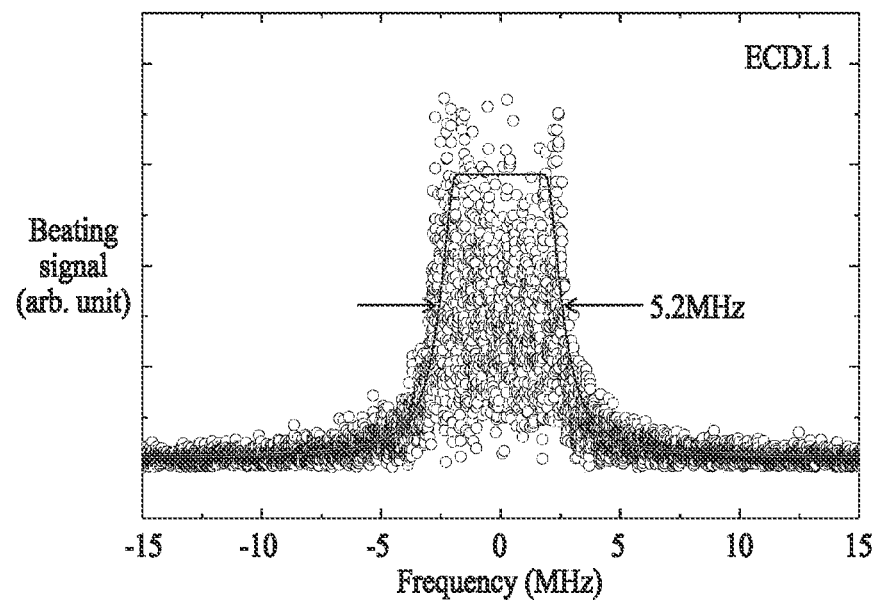
FIGS. 5A and 5B are diagrams illustrating frequency-stabilized density spectra obtained through frequency control in the first and second quantum light sources in the system for generating independent coherent photons frequency-stabilized to a transition of atoms for long-distance quantum communication according to an example embodiment.
Figure 5B:
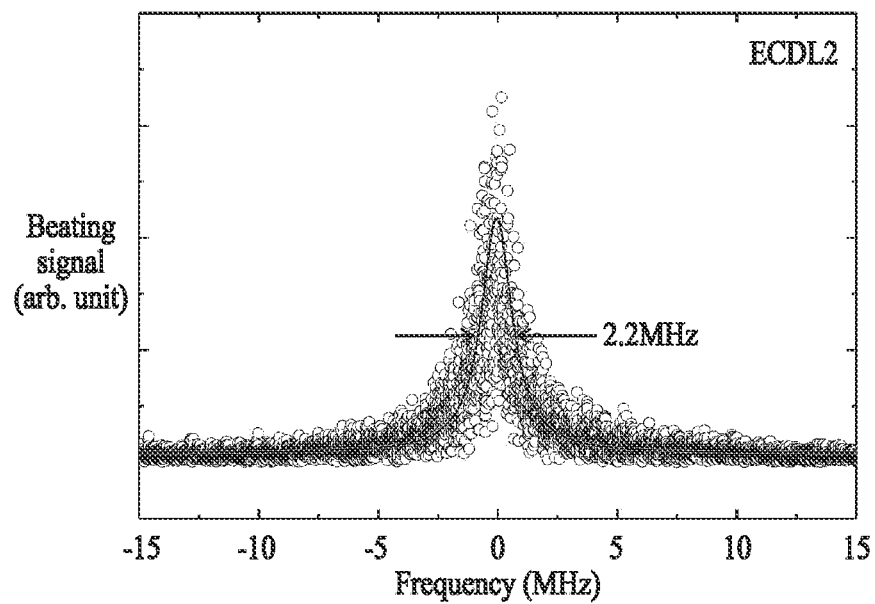

FIGS. 5A and 5B are diagrams illustrating frequency-stabilized density spectra obtained through frequency control in the first and second quantum light sources in the system for generating independent coherent photons frequency-stabilized to a transition of atoms for long-distance quantum communication according to an example embodiment.

FIG. 5A illustrates an example of a frequency-stabilized density spectrum by error-signal locking of SAS through the frequency modulation in ECDL1 of the first quantum light source 310.

As indicated by a solid curve in FIG. 5A, the spectrum exhibits a nearly rectangular shape with a width of approximately 5.2 MHz, and may exhibit a square shape when the modulation frequency is 1 KHz and the modulation width is ~4 MHz.

FIG. 5B illustrates an example of a frequency-stabilized density spectrum through offset locking of the PS in ECDL2 of the second quantum light source 320.

As indicated by a solid curve in FIG. 5B, it can be seen that the spectrum exhibits an almost Lorentz shape with a width of approximately 2.2 MHz, and a spectrum bandwidth may be wider than that of ECDL1 of the first quantum light source 310 in a free running mode due to PS offset locking.

On the other hand, in a case where the two independent continuous wave coherent photons (CWCPs) are incident on the beam splitter (BS), the simultaneous count probability as a time delay function (ΔT) can be expressed as Equation 1.

$$P_{coin.}(\Delta T) = 1 - V\Gamma_{12}(\Delta T)\cos(\Delta\omega\Delta T) \quad \text{[Equation 1]}$$

In Equation 1, V represents the visibility of the interference patterns of the HOM, which can be limited to a maximum of 0.5 in the case of a classical light source. In addition, $T_{12}(\Delta T)$ is a mutual coherence function between the two CWCPs, and Δω represents a frequency difference between the two CWCPs.

The shape and the width of the HOM interference patterns can be determined by combining the spectrum characteristics of the two CWCPs illustrated in FIGS. 5A and 5B.

FIG. 6 is a diagram illustrating an example of the HOM interference patterns of two independent continuous wave coherent photons (CWCPs) in the system for generating independent coherent photons frequency-stabilized to a transition of atoms for long-distance quantum communication according to an example embodiment.

A HOM interference pattern 610 illustrated in FIG. 6 is a time-resolved HOM interference pattern measured by using two independent frequency-stabilized CWCPs with the spectrum characteristics illustrated in FIGS. 5A and 5B, and represents a theoretical curve fitting when $\Delta\omega=0$.

In FIG. 6, a horizontal axis represents a time delay of the detection between two single-photon detectors, and a time-bin is set to 0.5 ns. A simultaneous count ratio accumulated over 200 seconds can be normalized to '1' to ensure a time delay that is much longer than the coherence time. In this case, the visibility of the HOM interference pattern 610 may be estimated to be 0.432±0.002 and the width to be 296±2 ns.

Hereinafter, a process of measuring the HOM interference pattern by changing the light frequency of ECDL2 of the second quantum light source 320 of FIG. 3 by adjusting the offset of the PS spectrum will be described.

FIGS. 7A through 7D are diagrams illustrating HOM interference patterns measured according to a frequency locking point for frequency stabilization in the system for generating independent coherent photons frequency-stabilized to a transition of atoms for long-distance quantum communication according to an example embodiment.

Figure 7A:
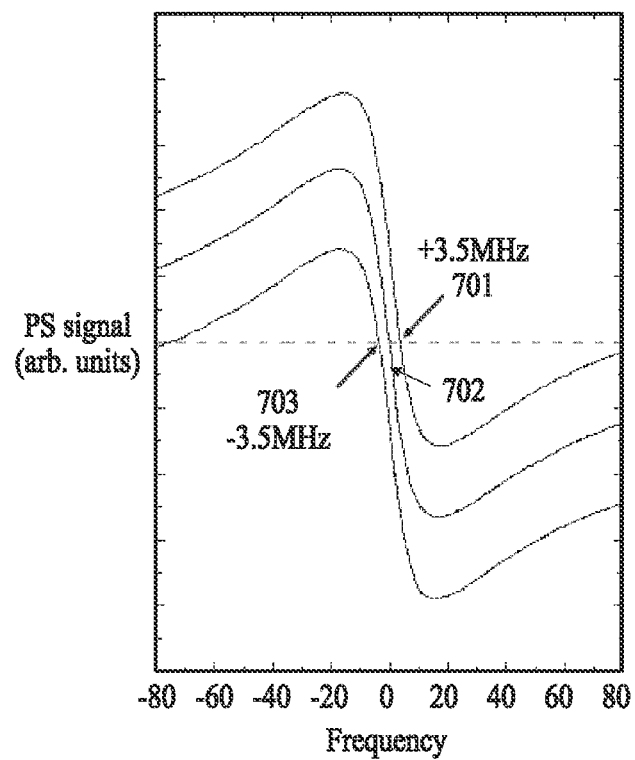
FIGS. 7A through 7D are diagrams illustrating HOM interference patterns measured according to a frequency locking point for frequency stabilization in the system for generating independent coherent photons frequency-stabilized to a transition of atoms for long-distance quantum communication according to an example embodiment.
Figure 7B:
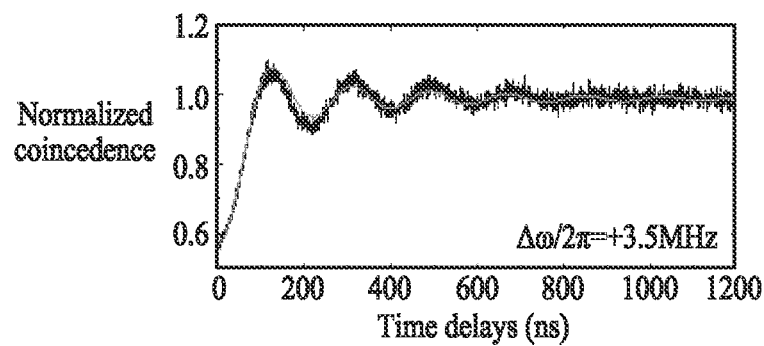
Figure 7C:
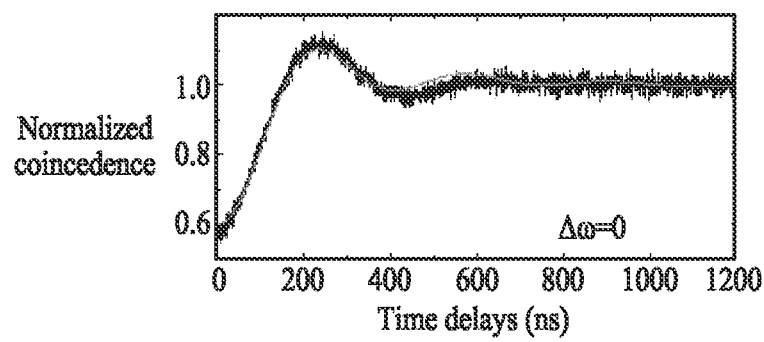
Figure 7D:
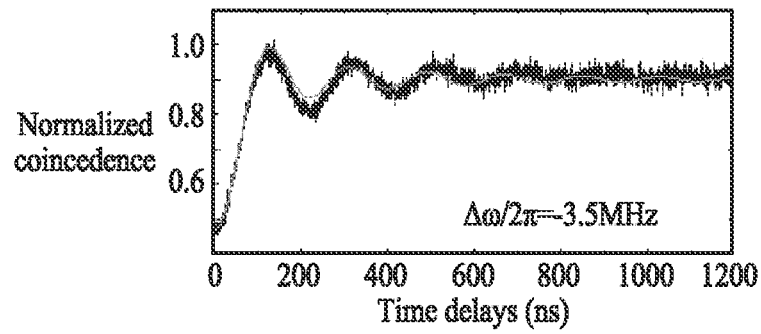
Figure 8A:
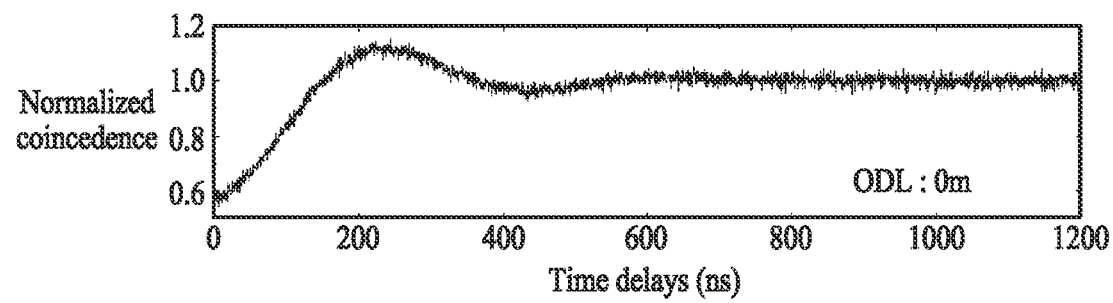
FIGS. 8A through 8D are diagrams illustrating an example of HOM interference patterns having a time delay due to an optical path difference of two independent continuous wave coherent photons (CWCPs) in the system for generating independent coherent photons frequency-stabilized to a transition of atoms for long-distance quantum communication according to an example embodiment.
Figure 8B:
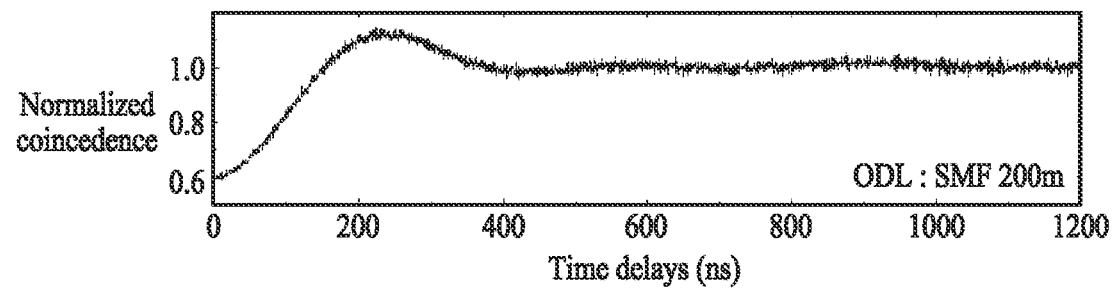
Figure 8C:
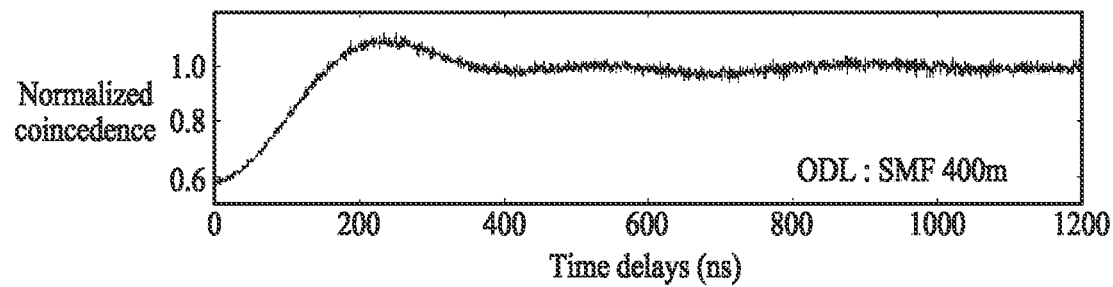
Figure 8D:
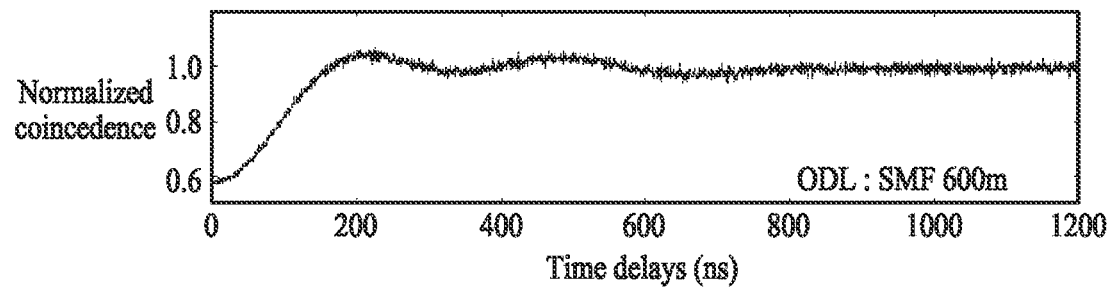

FIG. 7A illustrates three points (intersections with a dotted line) 701, 702, and 703 for frequency locking for the PS spectrum and the frequency stabilization, and FIGS. 7B, 7C, and 7D illustrate two-photon beat patterns (HOM interference patterns) for different offset frequencies according to the points 701, 702, and 703 for locking the frequency.

As an example, FIG. 7B illustrates a two-photon bit pattern during the frequency locking at the point 701, that is, when $\Delta\omega/2\pi=+3.5$ MHz, and FIG. 7C illustrates the two-photon bit pattern during the frequency locking at the point 702, that is, when $\Delta\omega/2\pi=0$, and FIG. 7D illustrates the two-photon bit pattern during frequency locking at the point 703, that is, when $\Delta\omega/2\pi=-3.5$ MHz.

Comparing FIGS. 7B, 7C, and 7D, it can be seen that even if the center frequency difference is larger than the spectrum bandwidth of the individual coherent light source, the visibility of the beat pattern is not lowered. That is, it can be seen from FIGS. 7A through 7D that the HOM interference measurement is stably possible regardless of the separated distance between the first and second quantum light sources 310 and 320.

In a case where the frequency is modulated according to the saturation absorption spectroscopy (SAS) as illustrated in FIG. 5A, due to the frequency modulated slowly by the error-signal locking of the SAS, theoretical goodness of fit of the interference patterns illustrated in FIGS. 7B, 7C, and 7D may not have a shape that exactly matches reality. In this regard, two independent CWCPs can be stably prepared through local and remote frequency stabilization relative to the atomic transition, which is useful for stably measuring the HOM interference regardless of the separated distance of the light sources.

FIGS. 8A through 8D are diagrams illustrating an example of HOM interference patterns having a time delay due to an optical path difference of two independent continuous wave coherent photons (CWCPs) in the system for generating independent coherent photons frequency-stabilized to a transition of atoms for long-distance quantum communication according to an example embodiment.

In FIGS. 8A through 8D, in order to check whether or not two CWCPs with independent and narrow bandwidths are affected by a random time delay between two photons interfering at the input port of the beam splitter (BS), an example is illustrated for measuring the HOM interference patterns for three optical delay paths up to the beam splitter (BS) by adding a single-mode fiber spool (200 m, 400 m, and 600 m) in the path of ECDL1.

FIGS. 8A through 8D illustrate the HOM interference patterns with the time delay due to the optical path difference between two independent CWCPs when the length of the single-mode optical fiber is 0 m, 200 m, 400 m, and 600 m, respectively.

It can be seen that the HOM interference patterns illustrated in FIGS. 8A through 8D are measured under the same conditions as that when the HOM interference pattern 610 of FIG. 6 described above is measured, and the input time delay of the beam splitter (BS) due to the optical path length difference is much longer than the coherence length of individual CWCP, but the HOM interference still appears and there is no change in visibility.

In a case where two independent CWCPs are used to observe the HOM interference, the relative phase between the two photons is random, but if time-resolved measurement technology is used to observe the interference, there is no limit in the difference in the optical path length from each quantum source to the beam splitter (BS). This is because the mutual coherence is defined by the degree of temporal first-order coherence of the output photon of the beam splitter (BS) in the superposed state determined by detection of a single photon at one of the two input ports of the beam splitter (BS).

As described above, according to the present disclosure, since the measurement of the HOM interference pattern is possible regardless of the length of the optical fiber cable connected to each of the plurality of quantum light sources, the continuous wave coherent photons (CWCP) generated from the mutually independent quantum light sources can be fully utilized for long-distance quantum communication that does not use the quantum repeater.

Therefore, through the independent coherent light source generating system 100 proposed in the present disclosure, the HOM interference pattern can be measured regardless of the separated distance between the quantum light sources or the optical delay path according to the length of the optical fiber cable connected to the quantum light source. Therefore, it is possible to provide the continuous wave coherent photon (CWCP) that can be used for quantum communication in more diverse environments.

Figure 9:
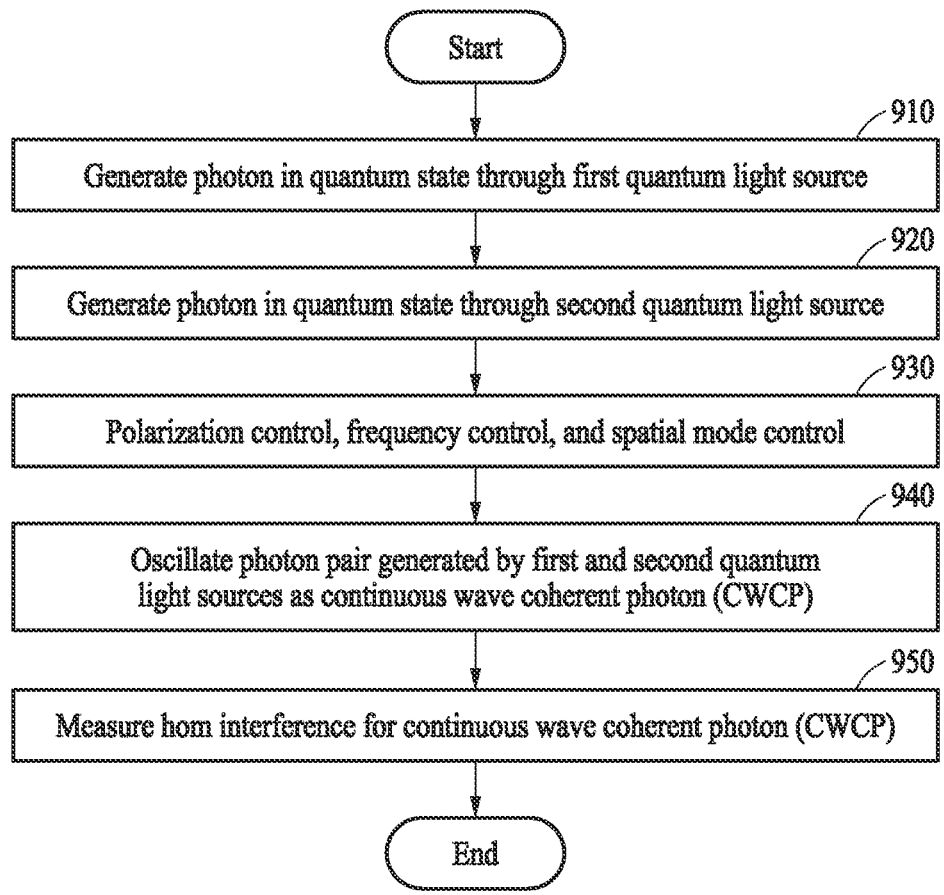
FIG. 9 is a flowchart illustrating a method for generating independent coherent photons frequency-stabilized to a transition of atoms for long-distance quantum communication according to an example embodiment.

FIG. 9 is a flowchart illustrating a method for generating independent coherent photons frequency-stabilized to transition of atoms for long-distance quantum communication according to an example embodiment.

The method for generating independent coherent photons frequency-stabilized to transition of atoms for long-distance quantum communication according to the present example embodiment may be performed by the above-described independent coherent light source generating system 100.

Referring to FIG. 9, in step 910, the independent coherent light source generating system 100 generates the photons in the quantum state through the first quantum light source using the alkali atom or the ensemble of alkali atoms as the medium.

In step 920, the independent coherent light source generating system 100 further generates the photons in the quantum state through the second quantum light source spatially separated from the first quantum light source.

In step 930, the independent coherent light source generating system 100 performs frequency control, polarization control, and spatial mode control on the first and second quantum light sources to enable the HOM interference measurement under the same conditions.

For example, referring to FIG. 3, the independent coherent light source generating systems 100 and 300 may spectrally control the laser light from the first quantum light source 310 according to the saturation absorption spectroscopy (SAS), and in a case where the laser light is spectrally controlled in the second quantum light source 320 according to the polarization spectroscopy (PS), stabilize the frequency through the error-signal locking obtained by the SAS in the first quantum light source 310, and use offset locking of the PS in the second quantum light source 320 to individually frequency-stabilize with the high-precision spectrum of atoms.

As described above, according to the present disclosure, by stabilizing the frequencies in the plurality of quantum light sources operating independently of each other by using fine transitions of atoms, it is possible to secure the stability of the frequencies with the precision corresponding to transitions of atoms, and reliably provide the stabilized continuous wave coherent photon (CWCP) of the frequency regardless of the separated distance between the plurality of quantum light sources.

In step 940, the independent coherent light source generating system 100 oscillates the photon pairs generated by the first and second quantum light sources that are independently frequency-stabilized as continuous wave coherent photon (CWCP).

In step 950, the independent coherent light source generating system 100 measures the HOM interference pattern by detecting the continuous wave coherent photons (CWCP) after moving them a certain distance by using the optical fiber cable.

If the visibility of the HOM interference pattern measured in step 950 is a certain ratio or more, the independent coherent light source generating system 100 may verify the continuous wave coherent photons (CWCP) oscillated by independent operations of the first and second quantum light sources as the continuous wave coherent photon (CWCP) capable of being utilized for long-distance quantum communication that does not use the quantum repeater.

As described above, according to the present disclosure, by providing the oscillation system that oscillates photons by frequency-stabilizing the photons in the quantum state emitted from a plurality of quantum light sources that are spatially separated and independently operated, the HOM interference can be measured, so that it is possible to provide the continuous-wave coherent photons (CWCP) which can be utilized for photon-based quantum communication.

The method according to example embodiments may be implemented in a form of program instructions that can be executed through various computer means and recorded in a computer-readable medium. The computer-readable medium may include program instructions, data files, data structures, and the like, alone or in combination. The program instructions recorded on the medium may be specially designed and configured for the example embodiment, or may be known and available to those skilled in the art of computer software. Examples of the computer-readable recording medium include magnetic media such as a hard disk, a floppy disk, and a magnetic tape, optical media such as a CD-ROM and a DVD, magneto-optical media such as a floppy disk, and hardware devices specially configured to store and execute program instructions, such as ROM, RAM, and flash memory. Examples of program instructions include not only machine language codes such as those generated by a compiler, but also high-level language codes that can be executed by a computer using an interpreter or the like. The hardware devices described above may be configured to operate as one or more software modules to perform the operations of the example embodiments, and vice versa.

Software may include a computer program, a code, an instruction, or a combination of one or more thereof, which configures a processing device to operate as desired or commands the device independently or collectively. Software and/or data may be permanently or temporarily embodied in any kind of machine, component, physical device, virtual equipment, computer storage medium or device, or signal wave to be transmitted to be interpreted by the processing device or to provide instructions or data to the processing device. Software may be distributed over networked computer systems and stored or executed in a distributed manner. Software and data may be stored in one or more computer-readable recording media.

As described above, although the example embodiments have been described with reference to the limited drawings, those skilled in the art may apply various technical modifications and variations based on the above description. For example, an appropriate result can be achieved in which the described technologies are performed in the order different from the described method, and/or the described components of the system, structure, apparatus, circuit, and the like are coupled or combined in a different form than the described method, or replaced or substituted by other components or equivalents.

Therefore, other implementations, other example embodiments, and equivalents to the claims are also within the scope of the following claims.

What is claimed is:

1. A method of generating independent coherent photons frequency-stabilized to transition of atoms for long-distance quantum communication, the method comprising:
    generating a photon in a quantum state from a first quantum light source including an alkali atom or an ensemble of alkali atoms therein as a medium;
    further generating a photon in a quantum state from a second quantum light source spatially separated from the first quantum light source and including the same medium as that of the first quantum light source therein; and
    oscillating a photon pair obtained by coupling the photons generated by the first and second quantum light sources as a continuous wave coherent photon (CWCP) for quantum communication.

2. The method of claim 1, wherein the first quantum light source is provided with an external-cavity diode laser (ECDL) that emits laser light according to a predetermined resonance frequency, and
    wherein the generating of the photon in the quantum state from the first quantum light source comprises:
    passing the laser light emitted by the ECDL through the medium; and
    generating the photon in the quantum state by splitting the laser light passing through the medium according to modulation spectroscopy selected as at least one method from among saturation absorption spectroscopy (SAS), polarization spectroscopy (PS), and absorption spectroscopy.

3. The method of claim 2, wherein the further generating of the photon in the quantum state from the second quantum light source comprises:
passing laser light emitted by an ECDL provided in the second quantum light source through the medium in the second quantum light source; and
further generating the photon in the quantum state by splitting the laser light passing through the medium according to modulation spectroscopy different from that of the first quantum light source.

4. The method of claim 2, wherein the oscillating as the continuous wave coherent photon further comprises:
feeding back to the ECDL a resonance frequency confirmed from a spectral spectrum obtained by splitting the laser light passing through the medium according to the selected modulation spectroscopy; and
controlling a resonance frequency at which the laser light is emitted from the ECDL if the feedback resonance frequency is different from the predetermined resonance frequency.

5. The method of claim 1, wherein a ½λ-phase delay plate (H) and a ¼λ-phase delay plate (Q) are provided in each of the first and second quantum light sources,
the method further comprising:
coupling the photon pair by performing polarization control through the ½λ-phase delay plates (H) and the ¼λ-phase delay plates (Q) so that polarization states of the photons generated by the first and second quantum light sources are coherent.

6. The method of claim 1, further comprising:
splitting a first photon incident on a beam splitter through an optical fiber cable connected to the first quantum light source by the beam splitter;
splitting a second photon incident on the beam splitter through an optical fiber cable connected to the second quantum light source by the beam splitter;
detecting, by each of a plurality of single-photon detectors (SPDs), a single photon generated by superimposing a split photon split from the first photon and a split photon split from the second photon into one; and
performing Hong-Ou-Mandel (HOM) interference measurement for the CWCP by analyzing a signal output from each of the SPDs through a time-correlated single-photon counter (TCSPC) according to the detection.

7. The method of claim 6, wherein the performing of the HOM interference measurement comprises:
performing the HOM interference measurement using a single photon having a correlation with time by alternately analyzing a signal output from any one of the SPDs through the TCSPC in a predetermined time unit.

8. The method of claim 6, further comprising:
determining whether or not the HOM interference measurement for the CWCP is possible by using the signal output from each of the SPDs after increasing and adjusting a length of the optical fiber cable by n times, wherein n is a natural number equal to or greater than 2; and
outputting a result value for implementable long-distance quantum communication corresponding to the length of the optical fiber cable if the HOM interference measurement is possible.

9. The method of claim 6, further comprising:
controlling a spatial mode that is one of factors affecting the quantum interference measurement so that the spatial mode in the first quantum light source and the spatial mode in the second quantum light source are the same by implementing the same type and length of the optical fiber cable connected to the first quantum light source and the optical fiber cable connected to the second quantum light source.

10. A non-transitory computer-readable storage medium storing instructions that, when executed by a processor, cause the processor to perform the method of claim 1.

11. A system for generating independent coherent photons frequency-stabilized to transition of atoms for long-distance quantum communication, the system comprising:
a generating unit configured to generate a photon in a quantum state from a first quantum light source including an alkali atom or an ensemble of alkali atoms therein as a medium, and further generate a photon in a quantum state from a second quantum light source spatially separated from the first quantum light source and including the same medium as that of the first quantum light source therein; and
an oscillation unit configured to oscillate a photon pair obtained by coupling the photons generated by the first and second quantum light sources as a continuous wave coherent photon (CWCP) for quantum communication.

12. The system of claim 11, wherein the first quantum light source is provided with an external-cavity diode laser (ECDL) that emits laser light according to a predetermined resonance frequency,
wherein the generating unit is configured to:
pass the laser light emitted by the ECDL through the medium; and
generate the photon in the quantum state by splitting the laser light passing through the medium according to modulation spectroscopy selected as at least one method from among saturation absorption spectroscopy (SAS), polarization spectroscopy (PS), and absorption spectroscopy.

13. The system of claim 12, wherein the generating unit is configured to:
pass laser light emitted by an ECDL provided in the second quantum light source through the medium in the second quantum light source; and
further generate the photon in the quantum state by splitting the laser light passing through the medium according to modulation spectroscopy different from that of the first quantum light source.

14. The system of claim 12, further comprising:
a frequency control unit configured to feed back to the ECDL a resonance frequency confirmed from a spectral spectrum obtained by splitting the laser light passing through the medium according to the selected modulation spectroscopy, and control a resonance frequency at which the laser light is emitted from the ECDL if the feedback resonance frequency is different from the predetermined resonance frequency.

15. The system of claim 11, further comprising:
an interference measurement unit configured to perform Hong-Ou-Mandel (HOM) interference measurement for the CWCP,
wherein the interference measurement unit comprises:
a splitting unit configured to split a first photon incident on a beam splitter through an optical fiber cable connected to the first quantum light source by the beam splitter, and split a second photon incident on the beam splitter through an optical fiber cable connected to the second quantum light source by the beam splitter;

a detection unit configured to detect, by each of a plurality of single-photon detectors (SPDs), a single photon generated by superimposing a split photon split from the first photon and a split photon split from the second photon into one; and an analysis unit configured to perform the HOM interference measurement for the CWCP by analyzing a signal output from each of the SPDs through a time-correlated single-photon counter (TCSPC) according to the detection.

16. The system of claim 15, wherein the analysis unit is configured to:

perform the HOM interference measurement using a single photon having a correlation with time by alternately analyzing a signal output from any one of the SPDs through the TCSPC in a predetermined time unit.

* * * * *